(12) United States Patent
Burrell, IV

(10) Patent No.: US 6,184,803 B1
(45) Date of Patent: Feb. 6, 2001

(54) NINE KEY ALPHANUMERIC BINARY KEYBOARD COMBINED WITH A THREE KEY BINARY CONTROL KEYBOARD AND COMBINATIONAL CONTROL MEANS

(76) Inventor: James W. Burrell, IV, P.O. Box 3822, Union, NJ (US) 07083-1891

( * ) Notice: Under 35 U.S.C. 154(b), the term of this patent shall be extended for 0 days.

(21) Appl. No.: 08/898,727

(22) Filed: Jul. 22, 1997

(51) Int. Cl.[7] ................................................... H03K 17/94

(52) U.S. Cl. ............................. 341/22; 341/23; 345/169; 379/93.18; 379/368

(58) Field of Search .................................. 341/22, 28, 23; 379/93.18, 368, 369, 370; 345/169

(56) References Cited

PUBLICATIONS

Witten, I. H. (1982), "Principles of Compute Speech" (pp. 247–249) London: Academic Press.*

* cited by examiner

*Primary Examiner*—Michael Horabik
*Assistant Examiner*—Timothy Edwards, Jr.
(74) *Attorney, Agent, or Firm*—Ezra Sutton

(57) ABSTRACT

This invention relates to a novel and way to use a twelve button telephone keypad for alphanumeric data entry. This invention also relates to a method of alphanumeric data entry using short duration or long duration binary key actuations using a simultaneous coding system and/or sequential coding system for communicating on a standard twelve key push-button telephone keypad. Two binary keys are used for an all capital letter mode or two binary keys for a lower-case letter mode, along with three binary keys for an upper-case letter mode, for producing full alphanumeric text, including punctuation, symbols and control.

13 Claims, 12 Drawing Sheets

FIG. 2A

| ALPHANUMERIC CHARACTER | CODING SEQUENCE |
|---|---|
| NUMBER MODE | # |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 0 | 0 |
| CLEAR ALL NUMERIC DATA | # |
| SEND | ### |
| ALPHABETIC MODE | * |
| A | 2* |
| B | 20 |
| C | 2# |
| D | 3* |
| E | 30 |
| F | 3# |
| G | 4* |
| H | 40 |
| I | 4# |
| J | 5* |
| K | 50 |
| L | 5# |
| M | 6* |
| N | 60 |

FIG. 2B

| | |
|---|---|
| O | 6# |
| P | 7* |
| Q | 1* |
| R | 70 |
| S | 7# |
| T | 8* |
| U | 80 |
| V | 8# |
| W | 9* |
| X | 90 |
| Y | 9# |
| Z | 1# |
| SPACE | 10 |
| PERIOD | *0 |
| BACKSPACE (ERASE) CONTINUE | ** |
| PUNCTUATION MODE 1-0 | *# (+) |
| ? | (*#) 1 |
| , | (*#) 2 |
| ! | (*#) 3 |
| " | (*#) 4 |
| ' | (*#) 5 |
| " | (*#) 6 |
| ( | (*#) 7 |
| ; | (*#) 8 |
| ) | (*#) 9 |
| : | (*#) 0 |
| NUMBER MODE | # OR ## |
| ALPHABETIC MODE | * |
| SEND | ### |

FIG. 5A

| ALPHANUMERIC CHARACTER | CODING SEQUENCE |
|---|---|
| NUMERIC MODE | # |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 0 | 0 |
| DASH | *# |
| BACKSPACE | # |
| CLEAR ALL NUMERIC DATA | ## |
| SEND | ### |
| 2-KEY ALPHABETIC MODE | * |
| A | 2* |
| B | 20 |
| C | 2# |
| D | 3* |
| E | 30 |
| F | 3# |
| G | 4* |
| H | 40 |
| I | 4# |
| J | 5* |
| K | 50 |
| L | 5# |
| M | 6* |
| N | 60 |

FIG. 5B

| | |
|---|---|
| O | 6# |
| P | 7* |
| Q | 1* |
| R | 70 |
| S | 7# |
| T | 8* |
| U | 80 |
| V | 8# |
| W | 9* |
| X | 90 |
| Y | 9# |
| Z | 1# |
| SPACE | 10 OR 00 |
| TAB | 000 |
| PERIOD | *0 |
| BACKSPACE (ERASE) CONTINUE | ** |
| DELETE PREVIOUS WORD | *** |
| PUNCTUATION MODE 1-0 | *# (+ ENTRY) |
| ? | (*#) 1 |
| ' | (*#) 2 |
| ! | (*#) 3 |
| " | (*#) 4 |
| , | (*#) 5 |
| " | (*#) 6 |
| ( | (*#) 7 |
| ; | (*#) 8 |
| ) | (*#) 9 |
| : | (*#) 0 |
| NUMERIC MODE | #0 |
| 2-KEY ALPHABETIC MODE | * |
| 3-KEY ALPHABETIC MODE | ** |
| SEND (ENTER) | ### |

FIG. 6A

| ALPHANUMERIC CHARACTER | CODING SEQUENCE |
|---|---|
| NUMERIC MODE | # |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 0 | 0 |
| DASH | *# |
| BACKSPACE | # |
| CLEAR ALL NUMERIC DATA | ## |
| SEND | ### |
| 3-KEY ALPHABETIC MODE | ** |
| a | 2* |
| A | 2** |
| b | 20 |
| B | 200 |
| c | 2# |
| C | 2## |
| d | 3* |
| D | 3** |
| e | 30 |
| E | 300 |
| f | 3# |
| F | 3## |
| g | 4* |
| G | 4** |

FIG. 6B

| | | |
|---|---|---|
| | h | 40 |
| | H | 400 |
| | i | 4# |
| | I | 4## |
| | j | 5* |
| | J | 5** |
| | k | 50 |
| | K | 500 |
| | l | 5# |
| | L | 5## |
| | m | 6* |
| | M | 6** |
| | n | 60 |
| | N | 600 |
| | o | 6# |
| | O | 6## |
| | p | 7* |
| | P | 7** |
| | q | 1* |
| | Q | 1** |
| | r | 70 |
| | R | 700 |
| | s | 7# |
| | S | 7## |
| | t | 8* |
| | T | 8** |
| | u | 80 |
| | U | 800 |
| | v | 8# |
| | V | 8## |

FIG. 6C

| | |
|---|---|
| w | 9* |
| W | 9** |
| x | 90 |
| X | 900 |
| y | 9# |
| Y | 9## |
| z | 1# |
| Z | 1## |
| SPACE | 10 OR 00 |
| PERIOD | *0 |
| + | 22* |
| - | 77# |
| x | 66* |
| / | 33* |
| \ | 220 |
| = | 330 |
| % | 77* |
| ¿ | 11* |
| ¡ | 33# |
| ñ | 660 |
| Ñ | 6600 |
| ç | 22# |
| Ç | 22## |
| [ | 770 |
| ] | 990 |
| ▼ | 250 |
| ▲ | 850 |
| ▶ | 450 |
| ◀ | 650 |

FIG. 6D

| | |
|---|---|
| HOME | 550 |
| TAB | 110 |
| * | 88* |
| # | 88# |
| @ | 28* OR 280 |
| & | 260 |
| $ | 66# |
| SHIFT | 880 |
| TAB | 000 |
| BACKSPACE (ERASE) CONTINUE | ** |
| DELETE PREVIOUS WORD | *** |
| PUNCTUATION MODE 1-0 | *# (+ ENTRY) |
| ? | (*#) 1 |
| . | (*#) 2 |
| ! | (*#) 3 |
| " | (*#) 4 |
| ' | (*#) 5 |
| " | (*#) 6 |
| ( | (*#) 7 |
| ; | (*#) 8 |
| ) | (*#) 9 |
| : | (*#) 0 |
| NUMERIC MODE | #0 |
| 2-KEY ALPHABETIC MODE | * |
| 3-KEY ALPHABETIC MODE | ** |
| SEND (ENTER) | ### |

FIG. 7

CALL ME AT HOME AT 730PM AT 123-456-7890

Call me at work @ (123)-456-7890

```
    C  a  l  l     m  e     :           a  t     w  o  r  k
** 2## 2* 5# 5# 00 6* 30 10 11 ** *#0 #0 2* 8* 00 9* 6* 70 50
   @                        30                   A  M     @
10 280 00 #0 11 ** *#0 #0 30 ** 2** 6** 10 28* 00
   123                 ) #0     -456 -7890
   123 ** *#9 #0       *#456*#7890
```

NINE KEY ALPHANUMERIC BINARY KEYBOARD COMBINED WITH A THREE KEY BINARY CONTROL KEYBOARD AND COMBINATIONAL CONTROL MEANS

FIELD OF THE INVENTION

This invention relates to a novel and logical twelve button telephone keypad labeling arrangement. This invention also relates to a method of alphanumeric data entry using short duration or long duration key actuations for simultaneous coding and/or sequential coding for communicating on the standard twelve key push-button telephone keypad. Two keys are used for an all capital letters mode or two keys for lower case letters mode, along with three keys for upper case letters mode, for producing full alphanumeric text, including punctuation, symbols and control. This computer terminal invention would be properly classified in the U.S. Patent classification system under:

CLASS 379 TELEPHONIC COMMUNICATIONS and subclasses;
- /52 INCLUDING AID FOR HANDICAPPED USER (E.G., VISUAL, TACTILE, HEARING AID COUPLING),
- /56 HAVING ELECTROMAGNETIC LINK FOR SPEECH OR PAGING SIGNAL (E.G., LIGHT WAVE LINK),
- /57 .Control of selectively responsive paging arrangement over telephone line,
- /58 .Radio telephone system or instrument,
- /59 ..Zoned or cellular system,
- /61 ..Including cordless extension set (i.e., having single subscriber line access),
- /63 ..Including supervisory or control signaling,
- /90 TELEPHONE LINE OR SYSTEM COMBINED WITH DIVERSE ELECTRICAL SYSTEM OR SIGNALING (E.G., COMPOSITE),
- /93 .With transmission of digital message signal over a telephone line,
- /97 ..By voice frequency signal (e.g., tone code),
- /98 ...By modulated audio tone,
- /100 .To produce visual-graphic copy reproduction (e.g., facsimile),
- /105 ..From terminal,
- /108 .Telegraphy,
- /109 ..Over telephone line,
- /350 SUPERVISORY OR CONTROL LINE SIGNALING,
- /372 Signal reception at substation,
- /419 TERMINAL,
- /428 .Housing or housing component,
- /434 ..Specified terminal configuration (e.g., novelty type).

The code part of this invention belongs in:
CLASS 341 CODED DATA GENERATION OR CONVERSION and sub-classes;
- /1 DIGITAL PATTER READING TYPE CONVERTER,
- /3 .Plural types of codes on a single carrier,
- /9 .Having combined (e.g., denominational, combinational code) coding pattern,
- /17 .Actuated by physical projection,
- /20 BODILY ACTUATED CODE GENERATOR,
- /21 .For handicapped user,
- /22 .Including keyboard or keypad,
- /23 ..Variable key legends,
- /30 ..For numerical pulse type transmission,
- /34 .Pressure sensitive actuation,
- /50 DIGITAL CODE TO DIGITAL CODE CONVERTERS,
- /56 .To or from multi-level codes,
- /57 ..Binary to or from ternary,
- /64 .To or from number or pulses,
- /67 .To or from variable length codes,
- /82 .To or from mixed code formats,
- /90 .To or from alphanumeric code formats,
- /106 .Coding from table look-up techniques.

This invention also belongs in:
CLASS 364 ELECTRICAL COMPUTERS AND DATA PROCESSING SYSTEMS and sub-classes;
- /130 DATA PROCESSING CONTROL SYSTEMS, METHODS OR APPARATUS,
- /140 .Sequential or selective,
- /141 ..State of condition or parameter (e.g., on/off),
- /142 ...Position responsive,
- /180 .Multiple modes (e.g., digital/analog),
- /188 .With operator control interface (e.g., control/display console),
- /189 ..Keyboard,
- /221 .Control systems,
- /221.6 ..Multiple mode,
- /222.2 .Communication/data transmission,
- /222.3 ..Telephone exchange,
OPERATIONAL CONTROL
- /260 .Data transfer,
- /260.1 ..external,
- /262.4 .Instructional sequence,
- /262.9 ..Other specific instruction sequence operation,
- /400 APPLICATIONS,
- /419.1 .Word processing,
- /419.14 ..Replacement for characters or words,
- /419.16 ..Multilingual,
- /419.17 ..Editing (i.e., deletion, insertion, blocking, hyphenation, punctuation or footnotes),
- /514 R .Communication engineering,
- /600 ELECTRIC HYBRID COMPUTER,
- /602 .Specialized function performed,
- /605 ..Integration or differentiation,
- /700 ELECTRICAL DIGITAL CALCULATING COMPUTER,
- /705.01 .Combined with diverse art device,
- /705.05 ..Communication device (e.g., telephone, radio, television),
- /709.01 .With specialized input,
- /709.08 ..Flexible input,
- /709.12 ..Including specific keyboard type information entry,
- /709.16 ...Key sequencing (i.e., sequence defines function),
- /710.01 .With specialized output,
- /710.08 ..Selective output,
- /710.09 ..Sequential output,
- /710.1 ..Using particular format,

APPLICATIONS

/916.2 ..Learning/trainable,

/919 .Communications/data transmission system,

/919.4 ..Telephone,

/919.5 ..Other specific communications application,

GENERIC DEVICE

/926 .Analog input/output,

/926.7 ..Character generator,

/933.9 .Terminal.

DESCRIPTION OF PRIOR ART

The twelve button touch-tone telephone keypad arrangement and twelve pairs of tones produced by independently depressing any one of the twelve buttons have become the standard throughout the world. Since the advent of the twelve key push-button telephone arrangement, many have tried to produce alphanumeric text and control means using only twelve buttons. This patent application is a continuation of a provisional patent application I filed on the 8th day of April, 1997, entitled "ALPHANUMERIC TELEPHONY KEYPAD DATA ENTRY METHOD" which is shown in FIGS. 2A and 2B. The alphabetic code, excluding punctuation, shown in FIGS. 2A and 2B, I invented in August of 1972. Since 1972, I have never disclosed this invention to anyone. This application is the completion of the development of my computer access telephonic code for communicating on any standard twelve button telephone keypad. In the telephony industry, the twelve key (four high/three wide) push-button telephone keypad arrangement with twenty-four letters of the alphabet, excluding the "Q" and "Z", arranged in groups of threes, located on the faces of the keys numbered two "2" through nine "9", has become the world standard. The actuation of any one of the twelve keys, produces an analog, dual tone multifrequency signal (DTMF), which is a combination of two analog voice frequency tones. The telephone system hardware then converts the analog DTMF tones into a digital signal for processing, digital phones being the exception. In the past, the "Q" and "Z" have been located on the face of the keys in a few different locations. The most common way in the past, is where the "Q" and "Z" are located on the "1" key. Usually the "Q" and "Z" are located next to each other above the "1".

U.S. Pat. No. 3,675,513 to James Flanagan, et al. discloses a communication system for exchanging alphanumeric information. Flanagan positions from left to right; The "Q", "Z" and period "." on the "1" key. The "Q" is produced by actuating the "1" key, followed by the actuation of the "0" key. The "Z" is produced by actuating the "1" key twice, followed by the actuation of the "0" key. The period "." is produced by actuating the "1" key three times, followed by the actuation of the "0" key.

U.S. Pat. No. 4,012,599 to Jerome Meyer discloses a communicator and encoding scheme. Meyer positions from left to right; The period ".", "Q" and "Z" on the "1" key. The period "." is produced by actuating the "*" key, followed by the actuation of the "1" key. The "Q" is produced by actuating the "0" key, followed by the actuation of the "1" key. The "Z" is produced by actuating the "#" key, followed by the actuation of the "1" key.

U.S. Pat. No. 4,427,848 to Peter Tsakanikas discloses an alphanumeric data transmission system. Tsakanikas positions from left to right; the "Q", "Z" and hyphen "-" on the "1" key, although there is no coding scheme to layout to figure out actuation combinations for data representation. Single actuation is used for the left data position, double actuation is used for the middle data position and triple actuation is used for the right data position to produce the desired alphabetic data.

U.S. Pat. No. 4,440,977 to John Pao, et al. discloses a sequential twelve key apparatus. Pao positions from left to right; the period ".", "Q" and "Z" on the "1" key. The period "." is produced by actuating the "1" key, followed by the actuation of the "*" key. The "Q" is produced by actuating the "1" key, followed by the actuation of the "0" key. The "Z" is produced by actuating the "1" key, followed by the actuation of the "#" key.

U.S. Pat. No. 4,532,378 to Yasunoba Nakayama, et al. discloses a telephone apparatus for alphanumeric data entry. Nakayama positions from left to right; the "Q", "Z" and period "." on the "1" key. Single key actuation for the left data position, double actuation for the middle data position and triple actuation for the right data position, followed by the actuation of the "0" key, to produce the desired alphabetic data.

U.S. Pat. No. 4,585,908 to Louis Smith discloses a data entry and display circuit. Smith represents from left to right; the "Q", a "(blank)" and a "Z" on the "1" key. The "Q" is produced by actuating the "1" key, followed by the actuation of the "#" key. The unfilled data position between the "Q" and "Z", referred to as "(blank)", is not used for anything. The "Z" is produced by actuating the "1" key, followed by the actuation of the "#" key. In Smith's patent application explanation, all numbers require double actuation of the numeric key to produce a number. Unlike this present invention and application, numeric data is produced by single numeric key actuation, while in a single key numeric mode. Smith also does not explain or claim a space, only cursor movement, and claims a circuit requiring an actuation of a key for an unspecified predetermined duration, along with a second key actuation, with a second unspecified predetermined duration of actuation. There is no conflict in what Smith claims in U.S. Pat. No. 4,585,908, to what is claimed in this patent application.

U.S. Pat. No. 4,650,927 to Leland James discloses a processor-assisted system for communicating using a telephone. James positions from left to right; the "Q" and "Z" on the "1" key. The "Q" is produced by actuating the "1" key. The "Z" is produced by actuating the "1" key. When the alphabetic word is completed, the user actuates the "*" key as a space, which sends the alphabetic data word to a computer to decipher what the word is.

U.S. Pat. No. 4,674,112 to George Kondraske, et al. discloses a communication apparatus including a method of use. Kondraske positions from left to right; the "Q", "Z" and apostrophe "'" on the "1" key. The "Q" is produced by actuating the "1" key. The "Z" is produced by actuating the "1" key. When the alphabetic word is completed, the user actuates the "*" key as a space, which sends the alphabetic data word to a computer to decipher what the word is.

U.S. Pat. No. 4,737,980 to William Curtin, et al. discloses a method and apparatus for inputting data into a computer. Curtin positions from left to right; the "Q", "Z" and a box(?) on the "1" key. Three alphabetic letters and the number on the key face are all represented by the same key actuation. A predetermined probability algorithm guesses what type of data the user entered into the phone/computer terminal.

U.S. Pat. No. 4,918,721 to Kazuo Hashimoto discloses a phone capable of producing upper-case and lower-case letters. Hasimoto positions from left to right; the "Q", "Z"

and "space" on the number "1" key. Two methods of data entry are disclosed. In the first, the "Q" is produced by actuating the "#" key, followed by the actuation the "1" key. The "Z" is produced by actuating the "#" key a twice, followed by the actuation of the "1" key. The "space" is produced by actuating the "#" key three times, followed by the actuation of the "1" key. In the second method of data entry, the "Q" is produced by actuating the "1" key twice, followed by the actuation of the "#" key. The "Z" is produced by actuating the "1" key twice, followed by the actuation of the "*" key. The "Z" is produced by actuating the "1" key three times, followed by the actuation of the "#" key. The "z" is produced by actuating the "1" key three times, followed by the actuation of the "*" key. The space " " is produced by actuating the "1" key four times, followed by the actuation of the "#" key.

U.S. Pat. No. 5,392,338 to Adel Danish, et al. discloses a method for entering alphabetic characters into a telephone apparatus. Danish et al. represents from left to right; the "Q" and "Z" on the "1" key. The "Q" is produced by actuating the "1" key. The "Z" is produced by actuating the "1" key twice. Numbers must be entered individually, followed by the actuation of the "#" key.

U.S. Pat. Nos. 3,647,973 to James et al., 4,005,388 to Morley et al., 4,007,443 to Bromberg et al., 4,191,854 to Coles, 4,307,266 to Messina, 4,426,555 to Underkoffler, 4,608,457 to Fowler et al., 4,825,464 to Wen, are additional prior art patents where the "Q" and "Z" are represented or located on the "0" key.

U.S. Pat. Nos. 3,526,892 to Bartlett et al., 3,573,376 to Bartlett et al., 3,618,038 to Stein, 3,746,793 to Sachs, 3,833,765 to Hillborn et al., 3,870,821 to Steury, 3,879,722 to Knowlton, 3,967,273 to Knowlton, 4,304,968 to Klausner et al., 4,344,069 to Prame, 4,381,502 to Prame, 4,500,751 to Darland et al., 4,649,563 to Risken, 4,658,417 to Hashimoto et al., 4,677,659 to Dargan, 4,817,129 to Risken, 4,988,997 to Prame, 5,117,455 to Danish, 5,163,084 to Kim et al., 5,303,288 to Duffy et al., 5,339,358 to Danish et al., 5,486,823 to Tsai, 5,548,634 to Gahang et al., 5,559,512 to Jasinski et al., disclose prior art patents that use the phone keypad to enter alphanumeric data.

U.S. Pat. Nos. 2,073,333 to Chireix, 3,381,276 to James, 3,582,554 to LeBlang, 3,778,553 to Rackman, 4,481,508 to Kamei et al., 4,486,741 to Nozawa et al., 4,680,278 to Davis,II et al., 4,724,423 to Kinoshita, 4,799,254 to Dayton et al., 4,860,234 to Lapeyre, 4,891,777 to Lapeyre, 4,910,697 to Lapeyre, 4,924,431 to Lapeyre, 4,999,795 to Lapeyre, 5,007,008 to Beers, 5,031,119 to Dulaney et al., 5,062,070 to Lapeyre, 5,067,103 to Lapeyre, 5,105,375 to Lapeyre, 5,124,940 to Lapeyre, 5,184,315 to Lapeyre, 5,274,693 to Waldman, 5,581,593 to Engelke et al., disclose other prior art patents.

With the advent of the alphanumeric pager and the transference of alphanumeric data using the telephone, a way of eliminating the middleman (data entry operator) is needed. This invention solves the problem of twelve button alphanumeric simultaneous and/or sequential coding for full alphanumeric text data entry.

SUMMARY OF THE INVENTION

This invention uses the standard twelve key push-button phone keypad arrangement to produce full alphanumeric text, including a space, punctuation, symbols and control. The difference in the present invention is the telephone keypad labeling, where the letters "Q" and "Z" are represented or located on the number "1" key, with a "space" positioned between the "Q" and "Z".

Numbers are produced by using the standard one button actuation while in the numeric mode. To produce the one-time use dash "—" between numbers, found in phone numbers, the left star "*" key is actuated simultaneously with or followed by the actuation of the right pound "#" key, which then returns the phone apparatus automatically to the numeric mode. To backspace while in the numeric mode, the right pound "#" key is actuated once. To delete all previously entered numeric data while in the numeric mode, the right pound "#" key is actuated, followed by the secondary actuation of the right pound "#" key. Actuation of the right pound "#" key three times, while in the numeric mode, produces the "ENTER/RETURN/SEND" function.

When the left star "*" key is depressed once while in the numeric mode, the phone or apparatus enters a continuous upper-case alphabetic mode to produce a letter of the alphabet or a space. Depressing the key with the desired alphabetical data shown in FIG. 3, in simultaneous combination with or followed by the left star "*" key for the left position data, the middle zero "0" key for the center position data, or the right pound "#" key for the right position data produces the desired alphabetic data, which is shown in FIGS. 5A and 5B. Actuating the left star "*" key twice while in the numeric mode, enters a lower-case and upper-case alphabetic mode, where secondary actuation of the second key actuated to produce a lower-case letter, produces an upper-case letter, which is shown in FIGS. 6A through 6D. Actuation of the middle zero "0" key, while in the alphabetic mode, followed by the secondary actuation of the middle zero "0" key, produces a space. Actuation of the middle zero "0" key three times successively, while in the alphabetic mode, produces the "TAB" function. Actuation of the left star "*" key, while in the alphabetic mode, followed by the secondary actuation of the left star "*" key, deletes the previously entered alphabetic or punctuation bit of data, otherwise known as the backspace. Actuation of the left star "*" key three times successively, while in the alphabetic mode, deletes the previously entered word. Actuation of the left star "*" key, while in the alphabetic mode, simultaneously with or followed by the actuation of the middle zero "0" key, produces a period ".". Actuation of the left star "*" key, while in the alphabetic mode, simultaneously with or followed by the actuation of the right pound "#" key, enters a one-time use punctuation mode, which is then followed by the desired punctuation data representation on one of the ten keys numbered one "1" through zero "0", where the "1" key produces a question mark "?", where the "2" key produces a comma ",", where the "3" key produces an exclamation mark "!", where the "4" key produces an open quote """, where the "5" key produces an apostrophe "'", where the "6" key produces a closed quote """, where the "7" key produces an open parenthesis "(", where the "8" key produces a semi-colon ";", where the "9" key produces a closed parenthesis ")"; where the "0" key produces a colon ":". After the actuation of the numbered punctuation key, the keyboard automatically returns to the previous alphabetic mode. Actuation of the right pound "#" key simultaneously with or followed by the actuation of the middle zero "0", key while in the alphabetic mode, returns the keyboard to the numeric mode.

BRIEF DESCRIPTION OF THE DRAWINGS

Further objects, features, and advantages of the present invention will become apparent upon the consideration of the following detailed description of the presently-preferred embodiment when taken in conjunction with the accompanying drawings, wherein:

FIGS. 2A and 2B show a coding scheme for use on the keypad of FIG. 1 or preferably on the keypad of FIG. 4, filed as a provisional application on 8th day of April, 1997, entitled "ALPHANUMERIC TELEPHONY KEYPAD DATA ENTRY METHOD".

FIGS. 5A and 5B show a continuous upper-case alphabetic coding scheme for use on the keypad of FIG. 1 or preferably on the keypad of FIG. 4.

FIGS. 6A through 6D show a lower-case and upper-case alphabetic coding scheme for use on the keypad of FIG. 1 or preferably on the keypad of FIG. 4.

Figures 7, 8:
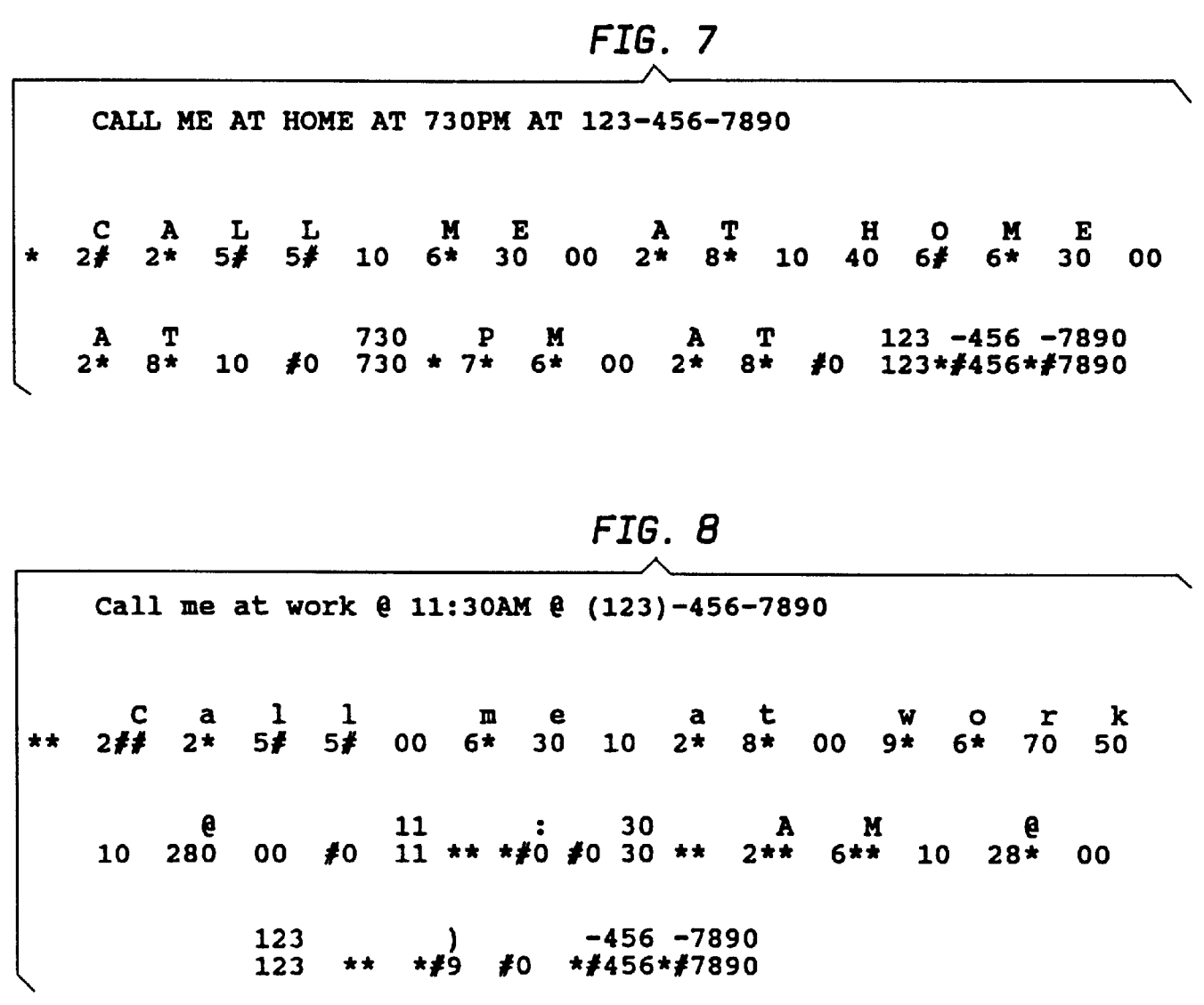

FIG. 7 shows an example of the actuation combinations for the continuous upper-case alphanumeric mode.

FIG. 8 shows an example of the actuation combinations for the lower-case and upper-case alphanumeric mode.

DETAILED DESCRIPTION OF THE INVENTION

Figure 1:
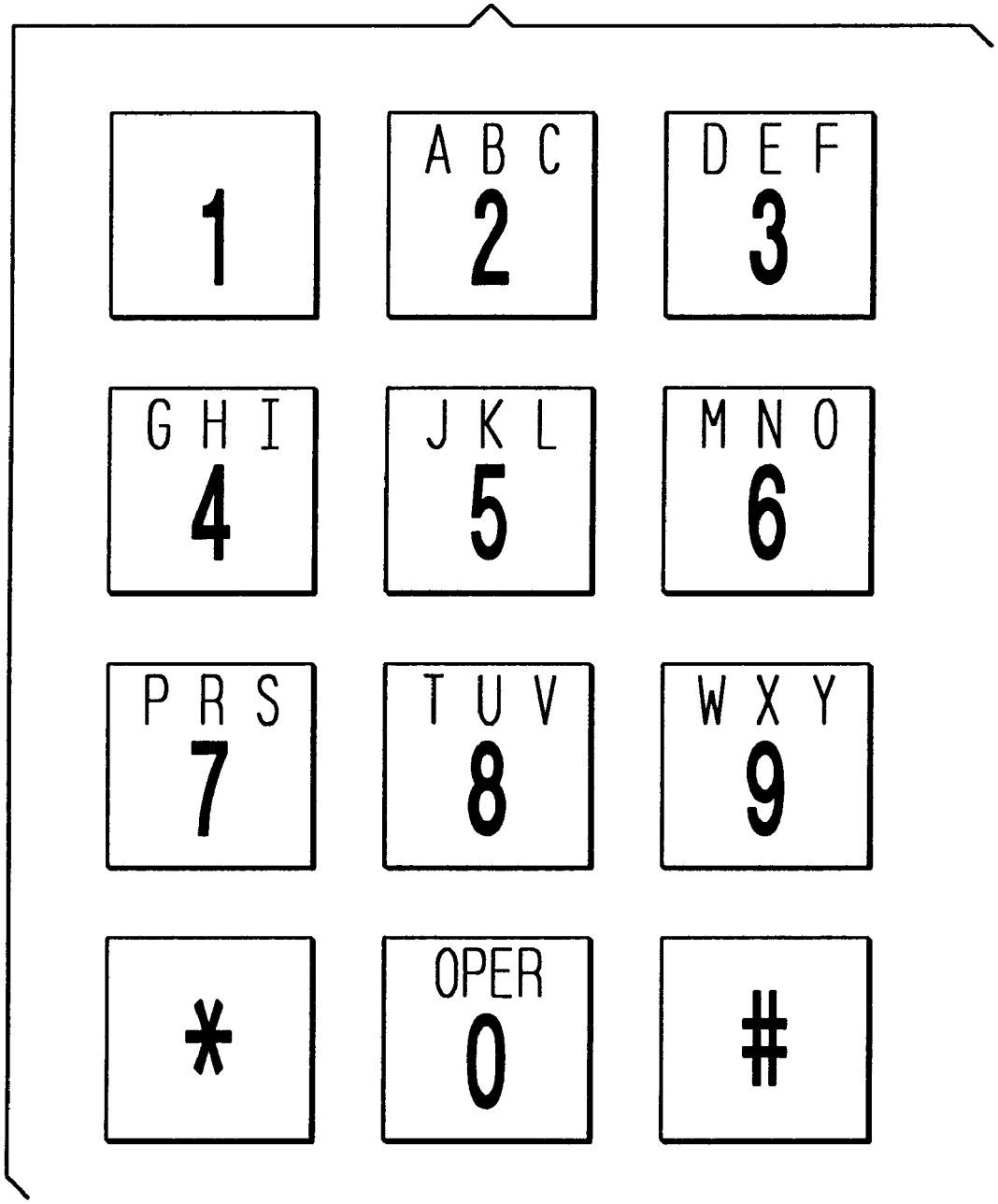
FIG. 1 shows the standard twelve key push-button telephone keypad configuration.
Figure 3:
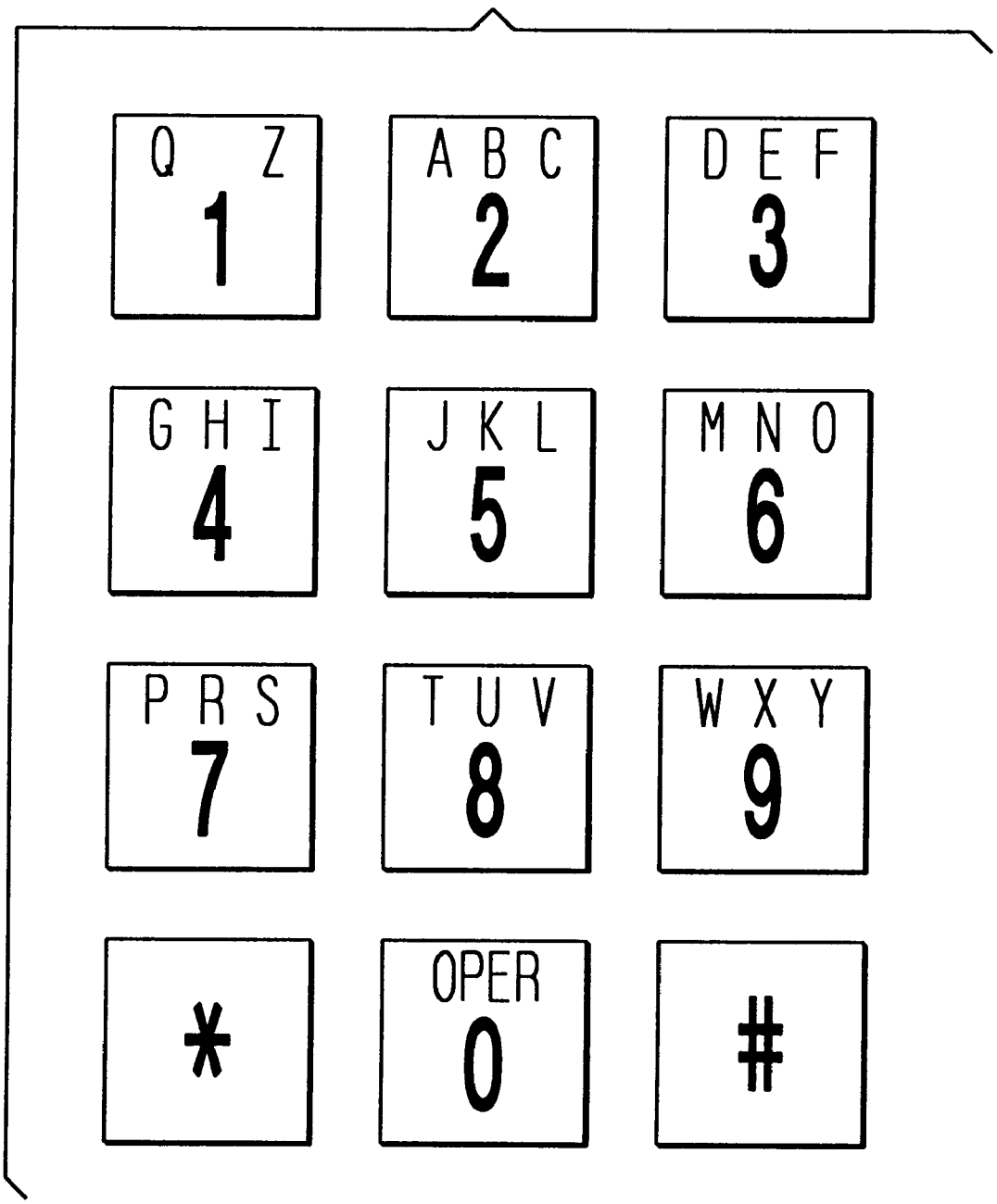
FIG. 3 shows the standard twelve key push-button telephone keypad configuration with the "Q" and "Z" located on the number "1" key with a space " " positioned between the "Q" and "Z."
Figure 4:
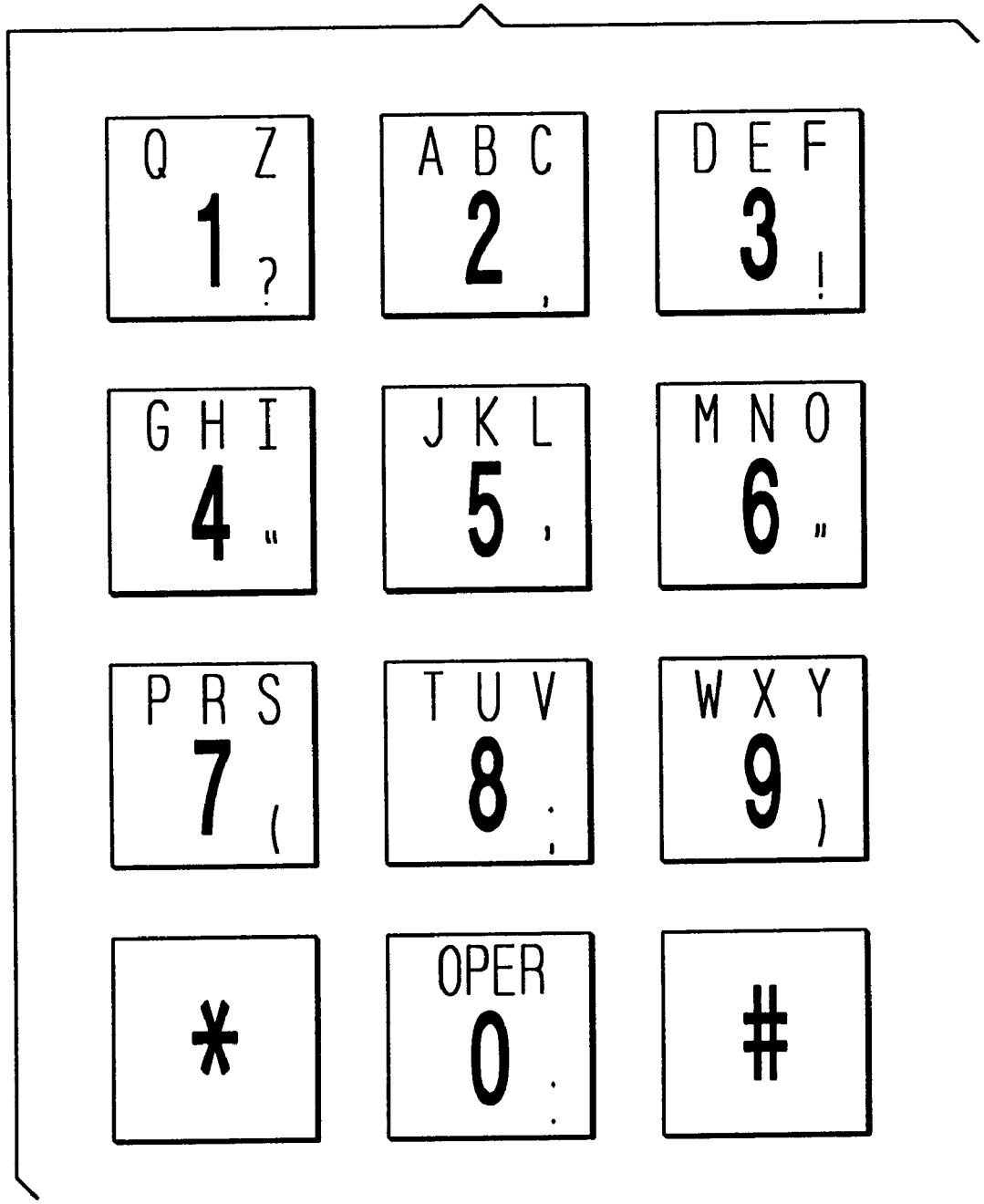
FIG. 4 shows the preferred embodiment for the twelve key push-button telephone keypad, with punctuation marks included.

In the telephone industry, it is well known that the depression of any given button on a standard twelve button telephone keypad generates one of twelve pairs of audio tones on the "touch tone" phone, or its digital data counterpart on a digital phone. This invention takes advantage of the customary arrangement of the markings on the face of the standard push-button telephone keypad. When one button is depressed, it produces the numerical value of the key depressed (except for the left star "*" key and the pound "#" key). When the left star "*" key is depressed once, the phone or apparatus enters a continuous upper-case alphabetic mode to produce the letters of the alphabet or a space. Depressing the key with the desired alphabetical data shown in FIG. 3, in simultaneous combination with or followed by the left star "*" key for the left position data, the middle zero "0" key for the center position data, or the right pound "#" key for the right position data produces the desired alphabetic data, which is shown in FIGS. 5A and 5B. Actuating the left star "*" key twice enters a lower-case and upper-case alphabetic mode, where secondary actuation of the second key actuated to produce a lower-case letter, produces an upper-case letter, which is shown in FIGS. 6A through 6D.

The present invention includes:

A nine key alphanumeric binary keyboard for entering alphanumeric data including a space, comprising nine keys, numbered one "1" through nine "9", combined with a three key binary control keyboard, preferably comprising the left star "*" key, the middle zero "0" key, and the right pound "#" key.

The "Q", "space", and "Z" are represented or located on the number "1" key, and the question mark "?" is produced by the actuation of the number "1" key while in the punctuation mode.

The "A", "B", and "C" are represented or located on the number "2" key, and the comma "," is produced by the actuation of the number "2" key while in the punctuation mode.

The "D", "E", and "F" are represented or located on the number "3" key, and the exclamation mark "!" is produced by the actuation of the number "3" key while in the punctuation mode.

The "G", "H", and "I" are represented or located on the number "4" key, and the open quote """ is produced by the actuation of the number "4", key while in the punctuation mode.

The "J", "K", and "L" are represented or located on the number "5" key, and the apostrophe "'" is produced by the actuation of the number "5" key while in the punctuation mode.

The "M", "N", and "O" are represented or located on the number "6" key, and the closed quote """ is produced by the actuation of the number "6" key while in the punctuation mode.

The "P", "R", and "S" are represented or located on the number "7" key, and the open parenthesis "(" is produced by the actuation of the number "7" key while in the punctuation mode.

The "T", "U", and "V" are represented or located on the number "8", key, and the semicolon ";" is produced by the actuation of the number "8" key while in the punctuation mode.

The "W", "X", and "Y" are represented or located on the number "9" key, and the closed parenthesis ")" is produced by the actuation of the number "9" key while in the punctuation mode.

The colon ":" is produced by the actuation of the number zero "0" key while in the punctuation mode.

Numbers are produced by using the standard one button actuation while in the numeric mode. To produce the one-time use dash "—" between numbers, found in phone numbers, the left star "*" key is actuated simultaneously with or followed by the actuation of the right pound "#" key, which then returns the phone apparatus automatically to the numeric mode. To backspace while in the numeric mode, the right pound "#" key is actuated once. To delete all previously entered numeric data, the right pound "#" key is actuated, followed by the secondary actuation of the right pound "#" key. Actuation of the right pound "#" key three times, while in the numeric mode, produces the "ENTER/RETURN/SEND" function.

Actuation of the left star "*" key, while in the numeric mode, exits the single key numeric mode and enters a continuous upper-case dual key (either simultaneous or sequential) alphabetic mode, where the desired alphabetic data or a space is actuated on the keys numbered one "1" through nine "9" in simultaneous combination with or followed by; the left star "*" key for left alphabetic data position representation on the previously actuated key, the middle zero "0" key for middle alphabetic data position representation on the previously actuated key, or the right pound "#" key for right alphabetic data position representation on the previously actuated key. Actuating the left star "*" key twice while in the numeric mode, enters a lower-case and upper-case alphabetic mode, where secondary actuation of the second key actuated to produce a lower-case letter, produces an upper-case letter, which is shown in FIGS. 6A through 6D.

The present invention provides a method for entering alphabetic data including a space, producible by one of nine keys numbered one "1" through nine "9", simultaneously with or followed by one of three keys; preferably the left star "*" key, the middle zero "0" key, or the right pound "#" key, to produce alphabetic data and a space.

The "A" is produced by the actuation of the "2" key simultaneously with or followed by the actuation of the left star "*" key. The "B" is produced by the actuation of the "2", key simultaneously with or followed by the actuation of the middle zero "0" key. The "C" is produced by the actuation of the "2" key simultaneously with or followed by the actuation of the right pound "#" key. The "D" is produced by the actuation of the "3" key simultaneously with or followed by the actuation of the left star "*" key. The "E" is produced by the actuation of the "3" key simultaneously with or followed by the actuation of the zero "0" key. The "F" is produced by the actuation of the "3" key simultaneously with or followed by the actuation of the pound "#" key. The "G" is produced by the actuation of the "4" key simultaneously with or followed by the actuation of the left star "*" key. The "H" is produced by the actuation of the "4", key simultaneously with or followed by the actuation of the middle zero "0" key. The "I" is produced by the actuation of the "4" key simultaneously with or followed by the actuation of the pound "#" key. The "J" is produced by the actuation of the "5" key simultaneously with or followed by the actuation of the left star "*" key. The "K" is produced by the actuation of the "5" key simultaneously with or followed by the actuation of the middle zero "0" key. The "L" is produced by the actuation of the "5" key simultaneously with or followed by the actuation of the pound "#" key. The "M" is produced by the actuation of the "6" key simultaneously with or followed by the actuation of the left star "*" key. The "N" is produced by the actuation of the "6" key simultaneously with or followed by the actuation of the middle zero "0" key. The "O" is produced by the actuation of the "6" key simultaneously with or followed by the actuation of the pound "#" key. The "P" is produced by the actuation of the "7" key simultaneously with or followed by the actuation of the left star "*" key. The "Q" is produced by the actuation of the "1" key simultaneously with or followed by the actuation of the left star "*" key. The "R" is produced by the actuation of the "7" key simultaneously with or followed by the actuation of the middle zero "0" key. The "S" is produced by the actuation of the "7" key simultaneously with or followed by the actuation of the pound "#" key. The "T" is produced by the actuation of the "8" key simultaneously with or followed by the actuation of the left star "*" key. The "U" is produced by the actuation of the "8" key simultaneously with or followed by the actuation of the middle zero "0" key. The "V" is produced by the actuation of the "8" key simultaneously with or followed by the actuation of the pound "#" key. The "W" is produced by the actuation of the "9" key simultaneously with or followed by the actuation of the left star "*" key. The "X" is produced by the actuation of the "9", key simultaneously with or followed by the actuation of the middle zero "0" key. The "Y" is produced by the actuation of the "9" key simultaneously with or followed by the actuation of the pound "#" key. The "Z" is produced by the actuation of the "1" key simultaneously with or followed by the actuation of the pound "#" key. The "space" is produced by the actuation of the "1" key simultaneously with or followed by the actuation of the middle zero "0" key.

The present invention also provides a method for entering upper-case and lower-case alphabetic data, including the space, producible by one of nine keys numbered one "1" through nine "9", simultaneously with or followed by one of the three binary control keys, preferably the left star "*" key, the middle zero "0" key, and the right pound "#" key, to produce alphabetic data. Double actuation of the of the binary control key, produces an upper-case letter.

The lower-case "a" is produced by the actuation of the "2" key simultaneously with or followed by the actuation of the left star "*" key; and the upper-case "A" is produced by the actuation of the "2" key simultaneously with or followed by the actuation of the left star "*" key, followed by the secondary actuation of the left star "*" key.

The lower-case "b" is produced by the actuation of the "2" key simultaneously with or followed by the actuation of the middle zero "0" key; and the upper-case "B" is produced by the actuation of the "2" key simultaneously with or followed by the actuation of the middle zero "0" key, followed by the secondary actuation of the middle zero "0" key.

The lower-case "c" is produced by the actuation of the "2" key simultaneously with or followed by the actuation of the right pound "#" key; and the upper-case "C" is produced by the actuation of the "2" key simultaneously with or followed by the actuation of the right pound "#" key, followed by the secondary actuation of the right pound "#" key.

The lower-case "d" is produced by the actuation of the "3" key simultaneously with or followed by the actuation of the left star "*" key; and the upper-case "D" is produced by actuation of the "3" key simultaneously with or followed by the actuation of the left star "*" key, followed by the secondary actuation of the left star "*" key.

The lower-case "e" is produced by the actuation of the "3" key simultaneously with or followed by the actuation of the middle zero "0" key; and the upper-case "E" is produced by the actuation of the "3" key simultaneously with or followed by the actuation of the middle zero "0" key, followed by the secondary actuation of the middle zero "0" key.

The lower-case "f" is produced by the actuation of the "3" key simultaneously with or followed by the actuation of the right pound "#" key; and the upper-case "F" is produced by the actuation of the "3" key simultaneously with or followed by the actuation of the right pound "#" key, followed by the secondary actuation of the right pound "#" key.

The lower-case "g" is produced by the actuation of the "4" key simultaneously with or followed by the actuation of the left star "*" key; and the upper-case "G" is produced by the actuation of the "4" key simultaneously with or followed by the actuation of the left star "*" key, followed by the secondary actuation of the left star "*" key.

The lower-case "h" is produced by the actuation of the "4" key simultaneously with or followed by the actuation of the middle zero "0" key; and the upper-case "H" is produced by the actuation of the "4" key simultaneously with or followed by the actuation of the middle zero "0" key, followed by the secondary actuation of the middle zero "0" key.

The lower-case "i" is produced by the actuation of the "4" key simultaneously with or followed by the actuation of the right pound "#" key; and the upper-case "I" is produced by the actuation of the "4" key simultaneously with or followed by the actuation of the right pound "#" key, followed by the secondary actuation of the right pound "#" key.

The lower-case "j" is produced by the actuation of the "5", key simultaneously with or followed by the actuation of the left star "*" key; and the upper-case "J" is produced by the actuation of the "5", key simultaneously with or followed by the actuation of the left star "*" key, followed by the secondary actuation of the left star "*" key.

The lower-case "k" is produced by the actuation of the "5" key simultaneously with or followed by the actuation of the middle zero "0" key; and the upper-case "K" is produced by the actuation of the "5" key simultaneously with or followed by the actuation of the middle zero "0" key, followed by the secondary actuation of the middle zero "0" key.

The lower-case "l" is produced by the actuation of the "5" key simultaneously with or followed by the actuation of the right pound "#" key; and the upper-case "L" is produced by the actuation of the "5" key simultaneously with or followed by the actuation of the right pound "#" key, followed by the secondary actuation of the right pound "#" key.

The lower-case "m" is produced by the actuation of the "6" key simultaneously with or followed by the actuation of the left star "*" key; and the upper-case "M" is produced by the actuation of the "6" key simultaneously with or followed by the actuation of the left star "*" key, followed by the secondary actuation of the left star "*" key.

The lower-case "n" is produced by the actuation of the "6" key simultaneously with or followed by the actuation of the middle zero "0" key; and the upper-case "N" is produced by the actuation of the "6" key simultaneously with or followed by the actuation of the middle zero "0" key, followed by the secondary actuation of the middle zero "0" key.

The lower-case "o" is produced by the actuation of the "6" key simultaneously with or followed by the actuation of the right pound "#" key; and the upper-case "O" is produced by the actuation of the "6" key simultaneously with or followed by the actuation of the right pound "#" key, followed by the secondary actuation of the right pound "#" key.

The lower-case "p" is produced by the actuation of the "7", key simultaneously with or followed by the actuation of the left star "*" key; and the upper-case "P" is produced by the actuation of the "7" key simultaneously with or followed by the actuation of the left star "*" key, followed by the secondary actuation of the left star "*" key.

The lower-case "q" is produced by the actuation of the "1" key simultaneously with or followed by the actuation of the left star "*" key; and the upper-case "Q" is produced by the actuation of the "1" key simultaneously with or followed by the actuation of the left star "*" key, followed by the secondary actuation of the left star "*" key.

The lower-case "r" is produced by the actuation of the "7" key simultaneously with or followed by the actuation of the middle zero "0" key; and the upper-case "R" is produced by the actuation of the "7" key simultaneously with or followed by the actuation of the middle zero "0" key, followed by the secondary actuation of the middle zero "0" key.

The lower-case "s" is produced by the actuation of the "7" key simultaneously with or followed by the actuation of the right pound "#" key; and the upper-case "S" is produced by the actuation of the "7" key simultaneously with or followed by the actuation of the right pound "#" key, followed by the secondary actuation of the right pound "#" key.

The lower-case "t" is produced by the actuation of the "8" key simultaneously with or followed by the actuation of the left star "*" key; and the upper-case "T" is produced by the actuation of the "8" key simultaneously with or followed by the actuation of the left star "*" key, followed by the secondary actuation of the left star "*" key.

The lower-case "u" is produced by the actuation of the "8" key simultaneously with or followed by the actuation of the middle zero "0" key; and the upper-case "U" is produced by the actuation of the "8" key simultaneously with or followed by the actuation of the middle zero "0" key, followed by the secondary actuation of the middle zero "0" key.

The lower-case "v" is produced by the actuation of the "8" key simultaneously with or followed by the actuation of the right pound "#" key; and the upper-case "V" is produced by the actuation of the "8" key simultaneously with or followed by the actuation of the right pound "#" key, followed by the secondary actuation of the right pound "#" key.

The lower-case "w" is produced by the actuation of the "9" key simultaneously with or followed by the actuation of the left star "*" key; and the upper-case "W" is produced by the actuation of the "9" key simultaneously with or followed by the actuation of the left star "*" key, followed by the secondary actuation of the left star "*" key.

The lower-case "x" is produced by the actuation of the "9" key simultaneously with or followed by the actuation of the middle zero "0" key; and the upper-case "X" is produced by the actuation of the "9" key simultaneously with or followed by the actuation of the middle zero "0" key, followed by the secondary actuation of the middle zero "0" key.

The lower-case "y" is produced by the actuation of the "9" key simultaneously with or followed by the actuation of the right pound "#" key; and the upper-case "Y" is produced by the actuation of the "9" key simultaneously with or followed by the actuation of the right pound "#" key, followed by the secondary actuation of the right pound "#" key.

The lower-case "z" is produced by the actuation of the "1" key simultaneously with or followed by the actuation of the right pound "#" key; and the upper-case "Z" is produced by the actuation of the "1" key simultaneously with or followed by the actuation of the right pound "#" key, followed by the secondary actuation of the right pound "#" key.

The "space" is produced by the actuation of the "1" key simultaneously with or followed by the actuation of the middle zero "0" key.

Actuation of the middle zero "0" key, while in the alphabetic mode, followed by the actuation of the middle zero "0" key, also a produces a space.

Actuation of the middle zero "0" key three times, while in the alphabetic mode, produces the "TAB" function.

Actuation of the left star "*" key, while in the alphabetic mode, followed by the left star "*" key, deletes the previously-entered bit of data, otherwise known as the backspace.

Actuation of the left star "*" key three times, while in the alphabetic mode, deletes the previously entered word.

Actuation of the left star "*" key, while in the alphabetic mode, simultaneously with or followed by the zero "0" key, produces a period ".".

Actuation of the left star "*" key, while in the alphabetic mode, simultaneously with or followed by the actuation of the right pound "#" key, enters a one-time use punctuation mode, followed by the desired punctuation data key representation of the ten keys numbered one "1" through zero "0", where the actuation of the "1" key produces a question mark "?", where the actuation of the "2" key produces a comma ",", where the actuation of the "3" key produces an exclamation mark "!", where the actuation of the "4" key produces an open quote """, where the actuation of the "5" key produces an apostrophe "'", where the actuation of the "6" key produces a closed quote """, where the actuation of the "7" key produces an open parenthesis actuation of the "(", where the actuation of the "8" key produces a semi-colon ";", where the actuation of the "9" key produces a closed parenthesis ")", where the actuation of the "0" key produces a colon ":"; and then returns to the previous alphabetic mode.

Actuation of the right pound "#" key simultaneously with or followed by the actuation of the middle zero "0" key, while in the alphabetic mode, returns the twelve-key telephone keyboard to the numeric mode.

A latitude of modification, change, and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein.

What is claimed is:

1. A nine key alphanumeric binary keyboard for entering alphanumeric data including a space, comprising nine keys numbered one "1" through nine "9", combined with a first, second and third key binary control keyboard comprising, the left star "*" key, the middle zero "0" key, and the right pound "#" key; the twelve key keyboard improvement comprising:
   a) wherein the "Q", "space", and "Z", read from left to right, are represented by said number "1" key, and the question mark "?" is represented by said number "1" while in the punctuation mode;
   b) wherein the "A", "B", and "C"; read from left to right, are represented by said number "2" key, and comma "," is represented by said number "2" key while in the punctuation mode;
   c) wherein the "D", "E", and "F", read from left to right, are represented by said number "3" key, and the exclamation mark "!" is represented by said number "3" key while in the punctuation mode;
   d) wherein the "G", "H", and "I", read from left to right, are represented by said number "4" key, and open quote """ is represented by said number "4" key while in the punctuation mode;
   e) wherein the "J", "K", and "L", read from left to right, are represented by said number "5" key, and the apostrophe "'" is represented by said number "5" key while in the punctuation mode;
   f) wherein the "M", "N", and "O", read from left to right, are represented by said number "6" key, and the closed quote """ is represented by said number "6" key while in the punctuation mode;
   g) wherein the "P", "R", and "S", read from left to right, are represented by said number "7" key, and the open parentheses "(" is represented by said number "7" key while in the punctuation mode;
   h) wherein the "T", "U", and "V", read from left to right, are represented by said number "8" key, and semicolon ";" is represented by said number "8" key while in the punctuation mode;
   I) wherein the "W", "X", and "Y", read from left to right, are represented by said number "9" key, and closed parentheses ")" is represented by said number "9" key while in the punctuation mode; and
   j) wherein the colon ":" is represented by said number "0" key in the punctuation mode;
   k) wherein activating said third binary control key, while in a number mode, when not followed by the activation of said first binary control key or second binary control key, followed by the secondary activation of said third binary control key, when not followed by the activation of said first binary control key or second binary control key, deletes all numeric data,
   l) wherein activating said first binary control key while in an alphabet mode, followed by the secondary activation of said first binary control key, followed by the trinary activation of said first binary control key, deletes the previously entered word.

2. A nine key alphanumeric binary keyboard for entering alphanumeric data including a space, comprising nine keys numbered one "1" through nine "9", combined with a three key binary control keyboard, comprising the left star "*" key, the middle zero "0" key, and the right pound "#" key; the twelve key keyboard improvement in accordance with claim 1 further comprising:
   a) wherein the "Q", "space", and "Z" read from left to right are located on said number "1" key, and the question mark "?" is represented by said number "1" key while in the punctuation mode;
   b) wherein the "A", "B", and "C" read from left to right are located on said number "2" key, and the comma "," is represented by said number "2" key while in the punctuation mode;
   c) wherein the "D", "E", and "F" (read from left to right) are located on said number "3" key, and the exclamation mark "!" is represented by said number "3" key while in the punctuation mode;
   d) wherein the "G", "H", and "I" read from left to right are located on said number "4" key, and the open quote """ is represented by said number "4" key while in the punctuation mode;
   e) wherein the "J", "K", and "L" read from left to right are located on said number "5" key, and the apostrophe "'" is represented by said number "5" key while in the punctuation mode;
   f) wherein the "M", "N", and "O" read from left to right are located on said number "6" key, and the closed quote """ is represented by said number "6" key while in the punctuation mode;
   g) wherein the "P", "R", and "S" read from left to right are located on said number "7" key, and the open parenthesis "(" is represented by said number "7" key while in the punctuation mode;
   h) wherein the "T", "U", and "V" read from left to right are located on said number "8" key, and the semicolon ";" is represented by said number "8" key while in the punctuation mode;
   i) wherein the "W", "X", and "Y" read from left to right are located on said number "9" key, and the closed parenthesis ")" is represented by said number "9" key while in the punctuation mode; and
   j) wherein the colon ":" is represented by said number "0" key while in the punctuation mode.

3. A nine key alphanumeric binary keyboard for entering alphanumeric data including a space, comprising nine keys numbered one "1" through nine "9", combined with a three key binary control keyboard, comprising the left star "*" key, the middle zero "0" key, and the right pound "#" key; the twelve key keyboard improvement in accordance with claim 1 further comprising:
   a) wherein the "Q", "space", and "Z" read from left to right are located on said number "i" key, and the question mark "?" is located on said number "1" key while in the punctuation mode;
   b) wherein the "A", "B", and "C" read from left to right are located on said number "2" key, and the comma "," is located on said number "2", key while in the punctuation mode;
   c) wherein the "D", "E", and "F" read from left to right are located on said number "3" key, and the exclamation mark "!" is located on said number "3" key while in the punctuation mode;
   d) wherein the "G", "H", and "I" read from left to right are located on said number "4" key, and the open quote """ is located on said number "4" key while in the punctuation mode;
   e) wherein the "J", "K", and "L" read from left to right are located on said number "5" key, and the apostrophe is located on said number "5" key while in the punctuation mode;

f) wherein the "M", "N", and "O" read from left to right are located on said number "6" key, and the closed quote """" is located on said number "6" key while in the punctuation mode;

g) wherein the "P", "R", and "S" read from left to right are located on said number "7" key, and the open parenthesis "(" is located on said number "7" key while in the punctuation mode;

h) wherein the "T", "U", and "V" read from left to right are located on said number "8" key, and the semicolon ";" is located on said number "8", key while in the punctuation mode; and i) wherein the "W", "X", and "Y" read from left to right are located on said number "9", key, and the closed parenthesis ")" is located on said number "9" key while in the punctuation mode;

j) wherein the colon ":" is represented by said number "0" key while in the punctuation mode.

4. The twelve key keyboard improvement of claim 1, further comprising:

a) wherein the actuation of said left star "*" key exits the single key numeric mode and enters a continuous upper-case combinational key actuation which is a simultaneous or sequential actuated alphabetic mode, where the desired alphabetic data on said keys one "1" through nine "9" is actuated simultaneously with or followed by; said left star "*" key for left alphabetic data position representation, said middle zero "0" key for middle alphabetic data position representation, or said right pound "#" key for right alphabetic data position representation;

b) wherein the actuation of said left star "*" key, followed by the secondary actuation of said left star "*" key, exits the single key numeric mode and enters a lower-case and upper-case combinational key actuation, which is a simultaneous and/or sequential actuated alphabetic mode, where the desired alphabetic data on said keys one "1" through nine "9" is actuated simultaneously with or followed by: said left star "*" key for left alphabetic data position representation, said middle zero "0" key for middle alphabetic data position representation, or said right pound "#" key for right alphabetic data position representation, where secondary actuation of the second actuated binary control key, produces the upper-case letter;

c) wherein the actuation of said middle zero "0" key, while in the alphabetic mode, followed by the secondary actuation of said middle zero "0" key, produces a space;

d) wherein the actuation of said middle zero "0" key three times succesively, while in the alphabetic mode, produces the "TAB" function;

e) wherein the actuation of said left star "*" key, while in the alphabetic mode, followed by the secondary actuation of said left star "*" key, deletes the previously entered alphabetic or punctuation bit of data, defined as a backspace;

f) wherein the actuation of said left star "*" key three times succesively, while in the alphabetic mode, deletes the previously entered word;

g) wherein the actuation of said left star "*" key, while in the alphabetic mode, simultaneously with or followed by the actuation of said middle zero "0" key, produces a period ".";

h) wherein the actuation of said left star "*" key, while in the alphabetic mode, simultaneously with or followed by the actuation of said right pound "#" key, enters a said one-time use punctuation mode, which is then followed by the actuation of the key with the desired punctuation data representation on one of the ten keys numbered one "1" through zero "0", where said "1" key produces a said question mark "?", where said "2" key produces a said comma ",", where said "3" key produces a said exclamation mark "!", where said "4" key produces a said open quote """", where said "5" key produces a said apostrophe "'", where said "6" key produces a said closed quote """", where said "7" key produces a said open parenthesis "(", where said "8" key produces a said semi-colon ";", where said "9" key produces a said closed parenthesis ")"; where said "0" key produces a said colon ":"; and after actuation of said numbered punctuation key, said keyboard returns to said previous alphabetic mode; and i) wherein the actuation of said right pound "#" key simultaneously with or followed by the actuation of said middle zero "0" key while in the alphabetic mode, returns said keyboard to the numeric mode.

5. A method for entering alphabetic data including the space, 1 and 0, using the keyboard of claim 1, where the actuation of one key of a nine key alphanumeric binary keyboard with keys numbered one "1" through nine "9", combined with the actuation of one key of a three key binary control keyboard, preferably comprising the left star "*" key, the middle zero "0" key and the right pound "#" key, comprising the step of:

actuating a selected one of said first set of nine keys, simultaneously with or followed by the actuation of a selected one of said second set of three keys, where said left star "*" key represents the left alphabetic data position, said middle zero "0" key represents the middle alphabetic data position, and said right pound "#" key represents the right alphabetic data position, to produce the selected one of the alphabetic letters "A" through "Z" or a "space", 1 and 0.

6. A method for entering alphabetic data including the space, produced by the actuation of one of nine keys numbered one "1" through nine "9" simultaneously actuated with one of three keys; the left star "*" key, the middle zero "0" key and the right pound "#" key, in accordance with claim 5, comprising the steps of:

a) producing the "A" by the actuation of said "2" key simultaneously with the actuation of said left star "*" key;

b) producing the "B" by the actuation of said "2" key simultaneously with the actuation of said middle zero "0" key;

c) producing the "C" by the actuation of said "2" key simultaneously with the actuation of said right pound "#" key;

d) producing the "D" by the actuation of said "3" key simultaneously with the actuation of said left star "*" key;

e) producing the "E" by the actuation of said "3" key simultaneously with the actuation of said middle zero "0" key;

f) producing the "F" by the actuation of said "3", key simultaneously with the actuation of said right pound "#" key;

g) producing the "G" by the actuation of said "4" key simultaneously with the actuation of said left star "*" key;

h) producing the "H" by the actuation of said "4" key simultaneously with the actuation of said middle zero "0" key;

i) producing the "I" by the actuation of said "4" key simultaneously with the actuation of said right pound "#" key;

j) producing the "J" by the actuation of said "5" key simultaneously with the actuation of said left star "*" key;

k) producing the "K" by the actuation of said "5" key simultaneously with the actuation of said middle zero "0" key;

l) producing the "L" by the actuation of said "5" key simultaneously with the actuation of said right pound "#" key;

m) producing the "M" by the actuation of said "6" key simultaneously with the actuation of said left star "*" key;

n) producing the "N" by the actuation of said "6" key simultaneously with the actuation of said middle zero "0" key;

o) producing the "O" by the actuation of said "6" key simultaneously with the actuation of said right pound "#" key;

p) producing the "P" by the actuation of said "7" key simultaneously with the actuation of said left star "*" key;

q) producing the "Q" by the actuation of said "1" key simultaneously with the actuation of said left star "*" key;

r) producing the "R" by the actuation of said "7" key simultaneously with the actuation of said middle zero "0" key;

s) producing the "S" by the actuation of said "7" key simultaneously with the actuation of said right pound "#" key;

t) producing the "T" by the actuation of said "8" key simultaneously with the actuation of said left star "*" key;

u) producing the "U" by the actuation of said "8" key simultaneously with the actuation of said middle zero "0" key;

v) producing the "V" by the actuation of said "8" key simultaneously with the actuation of said right pound "#" key;

w) producing the "W" by the actuation of said "9" key simultaneously with the actuation of said left star "*" key;

x) producing the "X" by the actuation of said "9" key simultaneously with the actuation of said middle zero "0" key;

y) producing the "Y" by the actuation of said "9" key simultaneously with the actuation of said right pound "#" key;

z) producing the "Z" by the actuation of said "1" key simultaneously with the actuation of said right pound "#" key; and aa) producing the "space" by the actuation of said "1" key simultaneously with the actuation of said middle zero "0" key.

7. A method for entering alphabetic data including the space, produced by the actuation of one of nine keys numbered one "1" through nine "9" followed by the actuation of one of three keys; the left star "*" key, the middle zero "0" key and the right pound "#" key, in accordance with claim 5, comprising the steps of:

a) producing the "A" by the actuation of said "2" key followed by the actuation of said left star "*" key;

b) producing the "B" by the actuation of said "2" key followed by the actuation of said middle zero "0" key;

c) producing the "C" by the actuation of said "2" key followed by the actuation of said right pound "#" key;

d) producing the "D" by the actuation of said "3" key followed by the actuation of said left star "*" key;

e) producing the "E" by the actuation of said "3" key followed by the actuation of said middle zero "0" key;

f) producing the "F" by the actuation of said "3" key followed by the actuation of said right pound "#" key;

g) producing the "G" by the actuation of said "4" key followed by the actuation of said left star "*" key;

h) producing the "H" by the actuation of said "4" key followed by the actuation of said middle zero "0" key;

i) producing the "I" by the actuation of said "4" key followed by the actuation of said right pound "#" key;

j) producing the "J" by the actuation of said "5" key followed by the actuation of said left star "*" key;

k) producing the "K" by the actuation of said "5" key followed by the actuation of said middle zero "0" key;

l) producing the "L" by the actuation of said "5" key followed by the actuation of said right pound "#" key;

m) producing the "M" by the actuation of said "6" key followed by the actuation of said left star "*" key;

n) producing the "N" by the actuation of said "6" key followed by the actuation of said middle zero "0" key;

o) producing the "O" by the actuation of said "6" key followed by the actuation of said right pound "#" key;

p) producing the "P" by the actuation of said "7" key followed by the actuation of said left star "*" key;

q) producing the "Q" by the actuation of said "1" key followed by the actuation of said left star "*" key;

r) producing the "R" by the actuation of said "7" key followed by the actuation of said middle zero "0" key;

s) producing the "S" by the actuation of said "7" key followed by the actuation of said right pound "#" key;

t) producing the "T" by the actuation of said "8" key followed by the actuation of said left star "*" key;

u) producing the "U" by the actuation of said "8" key followed by the actuation of said middle zero "0" key;

v) producing the "V" by the actuation of said "8" key followed by the actuation of said right pound "#" key;

w) producing the "W" by the actuation of said "9" key followed by the actuation of said left star "*" key;

x) producing the "X" by the actuation of said "9" key followed by the actuation of said middle zero "0" key;

y) producing the "Y" by the actuation of said "9" key followed by the actuation of said right pound "#" key;

z) producing the "Z" by the actuation of said "1" key followed by the actuation of said right pound "#" key; and aa) producing the "space" by the actuation of said "1" key followed by the actuation of said middle zero "0" key.

8. The method for entering the alphabetic data of claim 5, further comprising the steps of:

a) actuation of said middle zero "0" key, while in the alphabetic mode, followed by the secondary actuation of said middle zero "0" key, produces a space;

b) actuation of said middle zero "0" key three times successively, while in the alphabetic mode, produces the "TAB" function;

c) actuation of said left star "*" key, while in the alphabetic mode, followed by the secondary actuation of said left star "*" key, deletes the previously entered alphabetic or punctuation bit of data, defined as a backspace;

d) actuation of said left star "*" key three times successively, while in the alphabetic mode, deletes the previously entered word;

e) actuation of said left star "*" key, while in the alphabetic mode, simultaneously with or followed by the actuation of said middle zero "0" key, produces a period ".";

f) actuation of said left star "*" key, while in the alphabetic mode, simultaneously with or followed by the actuation of said right pound "#" key, enters a said one-time use punctuation mode, which is then followed by the desired punctuation data representation on one of the ten keys numbered one "1" through zero "0", where said "1" key produces a said question mark "?", where said "2" key produces a said comma ",", where said "3" key produces a said exclamation mark "!", where said "4" key produces a said open quote """, where said "5" key produces a said apostrophe "'", where said "6" key produces a said closed quote """, where said "7" key produces a said open parenthesis "(", where said "8", key produces a said semi-colon ";", where said "9" key produces a said closed parenthesis ")"; where said "0" key produces a said colon ":", and after the actuation of said numbered punctuation key, said keyboard returns to said previous alphabetic mode; and g) actuation of said right pound "#" key simultaneously with or followed by the actuation of said middle zero "0" key while in the alphabetic mode, returns said keyboard to the numeric mode.

9. A method for entering alphabetic data including the space, 1 and 0, using the keyboard of claims 1, where the actuation of one key of a nine key alphanumeric binary keyboard with keys numbered one "1" through nine "9", is combined with the actuation of one key of a three key binary keyboard, comprising the left star "*" key, the middle zero "0" key and the right pound "#" key, comprising the step of:

actuating a selected one of said first set of nine keys, simultaneously with or followed by the actuation of a selected one of said second set of three keys, where said left star "*" key represents the left alphabetic data position, said middle zero "0" key represents the middle alphabetic data position, and said right pound "#" key represents the right alphabetic data position, to produce the selected one of the lower-case alphabetic letters "a" through "z" or a "space", 1 and 0, and double actuation of said alphabetic data position key to produce the selected one of the upper-case alphabetic letters "A" through "Z".

10. A method for entering upper-case and lower-case alphabetic data including the space, produced by the actuation of a selected key of nine keys, numbered one "1" through nine "9", of said first set of keys simultaneously with the actuation of a selected key of said second set of three keys; the left star "*" key, the middle zero "0" key and the right pound "#" key, in accordance with claim 9, comprising the steps of:

a) producing the lower-case "a" by the actuation of said key simultaneously with the actuation of said left star "*" key; and producing the upper-case "A" by the actuation of said "2" key simultaneously with the actuation of said left star "*" key, followed by the secondary actuation of said left star "*" key;

b) producing the lower-case "b" by the actuation of said "2" key simultaneously with the actuation of said middle zero "0" key; and producing the upper-case "B" by the actuation of said "2" key simultaneously with the actuation of said middle zero "0" key, followed by the secondary actuation of said middle zero "0" key;

c) producing the lower-case "c" by the actuation of said "2" key simultaneously with the actuation of said right pound "#" key; and producing the upper-case "C" by the actuation of said "2" key simultaneously with the actuation of said right pound "#" key, followed by the secondary actuation of said right pound "#" key;

d) producing the lower-case "d" by the actuation of said "3" key simultaneously with the actuation of said left star "*" key; and producing the upper-case "D" by the actuation of said "3" key simultaneously with the actuation of said left star "*" key, followed by the secondary actuation of said left star "*" key;

e) producing the lower-case "e" by the actuation of said "3" key simultaneously with the actuation of said middle zero "0" key; and producing the upper-case "E" by the actuation of said "3" key simultaneously with the actuation of said middle zero "0" key, followed by the secondary actuation of said middle zero "0" key;

f) producing the lower-case "f" by the actuation of said "3" key simultaneously with the actuation of said right pound "#" key; and producing the upper-case "F" by the actuation of said "3" key simultaneously with the actuation of said right pound "#" key, followed by the secondary actuation of said right pound "#" key;

g) producing the lower-case "g" by the actuation of said "4" key simultaneously with the actuation of said left star "*" key; and producing the upper-case "G" by the actuation of said "4" key simultaneously with the actuation of said left star "*" key, followed by the secondary actuation of said left star "*" key;

h) producing the lower-case "h" by the actuation of said "4" key simultaneously with the actuation of said middle zero "0" key; and producing the upper-case "H" by the actuation of said "4" key simultaneously with the actuation of said middle zero "0" key, followed by the secondary actuation of said middle zero "0" key;

i) producing the lower-case "i" by the actuation of said "4" key simultaneously with the actuation of said right pound "#" key; and producing the upper-case "I" by the actuation of said "4" key simultaneously with the actuation of said right pound "#" key, followed by the secondary actuation of said right pound "#" key;

j) producing the lower-case "j" by the actuation of said "5" key simultaneously with the actuation of said left star "*" key; and producing the upper-case "J" by the actuation of said "5" key simultaneously with the actuation of said left star "*" key, followed by the secondary actuation of said left star "*" key;

k) producing the lower-case "k" by the actuation of said "5" key simultaneously with the actuation of said middle zero "0" key; and producing the upper-case "K" by the actuation of said "5" key simultaneously with the actuation of said middle zero "0" key, followed by the secondary actuation of said middle zero "0";

l) producing the lower-case "l" by the actuation of said "5" key simultaneously with the actuation of said right pound "#" key; and producing the upper-case "L" by the actuation of said "5" key simultaneously with the actuation of said right pound "#" key, followed by the secondary actuation of said right pound "#" key;

m) producing the lower-case "m" by the actuation of said "6" key simultaneously with the actuation of said left star "*" key; and producing the upper-case "M" by the actuation of said "6" key simultaneously with the actuation of said left star "*" key, followed by the secondary actuation of said left star "*" key;

n) producing the lower-case "n" by the actuation of said "6" key simultaneously with the actuation of said middle zero "0" key; and producing the upper-case "N" by the actuation of said "6" key simultaneously with the actuation of said middle zero "0" key, followed by the secondary actuation of said middle zero "0" key;

o) producing the lower-case "o" by the actuation of said "6" key simultaneously with the actuation of said right pound "#" key; and producing the upper-case "O" by the actuation of said "6" key simultaneously with the actuation of said right pound "#" key, followed by the secondary actuation of said right pound "#" key;

p) producing the lower-case "p" by the actuation of said "7" key simultaneously with the actuation of said left star "*" key; and producing the upper-case "P" by the actuation of said "7" key simultaneously with the actuation of said left star "*" key, followed by the secondary actuation of said left star "*" key;

q) producing the lower-case "q" by the actuation of said "1" key simultaneously with the actuation of said left star "*" key; and producing the upper-case "Q" by the actuation of said "1" key simultaneously with the actuation of said left star "*" key, followed by the secondary actuation of said left star "*" key;

r) producing the lower-case "r" by the actuation of said "7" key simultaneously with the actuation of said middle zero "0" key; and producing the upper-case "R" by the actuation of said "7" key simultaneously with the actuation of said middle zero "0" key, followed by the secondary actuation of said middle zero "0" key;

s) producing the lower-case "s" by the actuation of said "7" key simultaneously with the actuation of said right pound "#" key; and producing the upper-case "S" by the actuation of said "7" key simultaneously with the actuation of said right pound "#" key, followed by the secondary actuation of said right pound "#" key;

t) producing the lower-case "t" by the actuation of said "8" key simultaneously with the actuation of said left star "*" key; and producing the upper-case "T" by the actuation of said "8" key simultaneously with the actuation of said left star "*" key, followed by the secondary actuation of said left star "*" key;

u) producing the lower-case "u" by the actuation of said "8" key simultaneously with the actuation of said middle zero "0" key; and producing the upper-case "U" by the actuation of said "8" key simultaneously with the actuation of said middle zero "0" key, followed by the secondary actuation of said middle zero "0" key;

v) producing the lower-case "v" by the actuation of said "8" key simultaneously with the actuation of said right pound "#" key; and producing the upper-case "V" by the actuation of said "8" key simultaneously with the actuation of said right pound "#" key, followed by the secondary actuation of said right pound "#" key;

w) producing the lower-case "w" by the actuation of said "9" key simultaneously with the actuation of said left star "*" key; and producing the upper-case "W" by the actuation of said "9" key simultaneously with the actuation of said left star "*" key, followed by the secondary actuation of said left star "*" key;

x) producing the lower-case "x" by the actuation of said "9" key simultaneously with the actuation of said middle zero "0" key; and producing the upper-case "X" by the actuation of said "9" key simultaneously with the actuation of said middle zero "0" key, followed by the secondary actuation of said middle zero "0" key;

y) producing the lower-case "y" by the actuation of said "9" key simultaneously with the actuation of said right pound "#" key; and producing the upper-case "Y" by the actuation of said "9" key simultaneously with the actuation of said right pound "#" key, followed by the secondary actuation of said right pound "#" key; and z) producing the lower-case "z" by the actuation of said "1" key simultaneously with the actuation of said right pound "#" key; and producing the upper-case "Z" by the actuation of said "1" key simultaneously with the actuation of said right pound "#" key, followed by the secondary actuation of said right pound "#" key.

aa) producing the "space" by the actuation of said "1" key followed by the actuation of said middle zero "0" key.

11. A method for entering upper-case and lower-case alphabetic data including the space, produced by the actuation of a selected key of nine keys, numbered one "1" through nine "9", of said first set of keys followed by the actuation of a selected key of said second set of three keys; the left star "*" key, the middle zero "0" key and the right pound "#" key, in accordance with claim 9, comprising the steps of:

a) producing the lower-case "a" by the actuation of said "2" key followed by the actuation of said left star "*" key; and producing the upper-case "A" by the actuation of said "2" key followed by the actuation of said left star "*" key, followed by the secondary actuation of said left star "*" key;

b) producing the lower-case "b" by the actuation of said "2" key followed by the actuation of said middle zero "0" key; and producing the upper-case "B" by the actuation of said "2" key followed by the actuation of said middle zero "0" key, followed by the secondary actuation of said middle zero "0" key;

c) producing the lower-case "c" by the actuation of said "2" key followed by the actuation of said right pound "#" key; and producing the upper-case "C" by the actuation of said "2" key followed by the actuation of said right pound "#" key, followed by the secondary actuation of said right pound "#" key;

d) producing the lower-case "d" by the actuation of said "3" key followed by the actuation of said left star "*" key; and producing the upper-case "D" by the actuation of said "3" key followed by the actuation of said left star "*" key, followed by the secondary actuation of said left star "*" key;

e) producing the lower-case "e" by the actuation of said "3" key followed by the actuation of said middle zero "0" key; and producing the upper-case "E" by the actuation of said "3" key followed by the actuation of said middle zero "0" key, followed by the secondary actuation of said middle zero "0" key;

f) producing the lower-case "f" by the actuation of said "3" key followed by the actuation of said right pound "#" key; and producing the upper-case "F" by the actuation of said "3" key followed by the actuation of said right pound "#" key, followed by the secondary actuation of said right pound "#" key;

g) producing the lower-case "g" by the actuation of said "4" key followed by the actuation of said left star "*" key; and producing the upper-case "G" by the actuation of said "4" key followed by the actuation of said left star "*" key, followed by the secondary actuation of said left star "*" key;

h) producing the lower-case "h" by the actuation of said "4" key followed by the actuation of said middle zero "0" key; and producing the upper-case "H" by the actuation of said "4" key followed by the actuation of said middle zero "0" key, followed by the secondary actuation of said middle zero "0" key;

i) producing the lower-case "i" by the actuation of said "4" key followed by the actuation of said right pound "#" key; and producing the upper-case "I" by the actuation of said "4" key followed by the actuation of said right pound "#" key, followed by the secondary actuation of said right pound "#1" key;

j) producing the lower-case "j" by the actuation of said "5" key followed by the actuation of said left star "*" key; and producing the upper-case "J" by the actuation of said "5" key followed by the actuation of said left star "*" key, followed by the secondary actuation of said left star "*" key;

k) producing the lower-case "k" by the actuation of said "5" key followed by the actuation of said middle zero "0" key; and producing the upper-case "K" by the actuation of said "5" key followed by the actuation of said middle zero "0" key, followed by the secondary actuation of said middle zero "0";

l) producing the lower-case "l" by the actuation of said "5", key followed by the actuation of said right pound "#" key; and producing the upper-case "L" by the actuation of said "#" key followed by the actuation of said right pound "#" key, followed by the secondary actuation of said right pound "#" key;

m) producing the lower-case "m" by the actuation of said "6" key followed by the actuation of said left star "*" key; and producing the upper-case "M" by the actuation of said "6" key followed by the actuation of said left star "*" key, followed by the secondary actuation of said left star "*" key;

n) producing the lower-case "n" by the actuation of said "6" key followed by the actuation of said middle zero "0" key; and producing the upper-case "N" by the actuation of said "6" key followed by the actuation of said middle zero "0" key, followed by the secondary actuation of said middle zero "0" key;

o) producing the lower-case "o" by the actuation of said "6" key followed by the actuation of said right pound "#" key; and producing the upper-case "O" by the actuation of said "6" key followed by the actuation of said right pound "#" key, followed by the secondary actuation of said right pound "#" key;

p) producing the lower-case "p" by the actuation of said "7" key followed by the actuation of said left star "*" key; and producing the upper-case "P" by the actuation of said "7" key followed by the actuation of said left star "*" key, followed by the secondary actuation of said left star "*" key;

q) producing the lower-case "q" by the actuation of said "1" key followed by the actuation of said left star "*" key; and producing the upper-case "Q" by the actuation of said "1" key followed by the actuation of said left star "*" key, followed by the secondary actuation of said left star "*" key;

r) producing the lower-case "r" by the actuation of said "7" key followed by the actuation of said middle zero "0" key; and producing the upper-case "R" by the actuation of said "7" key followed by the actuation of said middle zero "0" key, followed by the secondary actuation of said middle zero "0" key;

s) producing the lower-case "s" by the actuation of said "7" key followed by the actuation of said right pound "#" key; and producing the upper-case "S" by the actuation of said "7" key followed by the actuation of said right pound "#" key, followed by the secondary actuation of said right pound "#" key;

t) producing the lower-case "t" by the actuation of said "8" key followed by the actuation of said left star "*" key; and producing the upper-case "T" by the actuation of said "8" key followed by the actuation of said left star "*" key, followed by the secondary actuation of said left star "*" key;

u) producing the lower-case "u" by the actuation of said "8" key followed by the actuation of said middle zero "0" key; and producing the upper-case "U" by the actuation of said "8" key followed by the actuation of said middle zero "0" key, followed by the secondary actuation of said middle zero "0" key;

v) producing the lower-case "v" by the actuation of said "8" key followed by the actuation of said right pound "#" key; and producing the upper-case "V" by the actuation of said "8" key followed by the actuation of said right pound "#" key, followed by the secondary actuation of said right pound "#" key;

w) producing the lower-case "w" by the actuation of said "9" key followed by the actuation of said left star "*" key; and producing the upper-case "W" by the actuation of said "9", key followed by the actuation of said left star "*" key, followed by the secondary actuation of said left star "*" key;

x) producing the lower-case "x" by the actuation of said "9" key followed by the actuation of said middle zero "0" key; and producing the upper-case "X" by the actuation of said "9" key followed by the actuation of said middle zero "0" key, followed by the secondary actuation of said middle zero "0" key;

y) producing the lower-case "y" by the actuation of said "9" key followed by the actuation of said right pound "#" key; and producing the upper-case "Y" by the actuation of said "9" key followed by the actuation of said right pound "#" key, followed by the secondary actuation of said right pound "#" key; and z) producing the lower-case "z" by the actuation of said "1" key followed by the actuation of said right pound "#" key; and producing the upper-case "Z" by the actuation of said "1" key followed by the actuation of said right pound "#" key, followed by the secondary actuation of said right pound "#" key.

aa) producing the "space" by the actuation of said "1" key followed by the actuation of said middle zero "0" key.

12. The method for entering the alphabetic data of claim 9, further comprising the steps of:

a) actuation of said middle zero "0" key, while in the alphabetic mode, followed by the secondary actuation of said middle zero "0" key, produces a space;

b) actuation of said middle zero "0" key three times successively, while in the alphabetic mode, produces the "TAB" function;

c) actuation of said left star "*" key, while in the alphabetic mode, followed by the secondary actuation of said left star "*" key, deletes the previously entered alphabetic or punctuation bit of data, otherwise known as the backspace;

d) actuation of said left star "*" key three times successively, while in the alphabetic mode, deletes the previously entered word;

e) actuation of said left star "*" key, while in the alphabetic mode, simultaneously with or followed by the actuation of said middle zero "0" key, produces a period ".";

f) actuation of said left star "*" key, while in the alphabetic mode, simultaneously with or followed by the actuation of said right pound "#" key, enters a said one-time use punctuation mode, which is then followed by the desired punctuation data representation on one of the ten keys numbered one "1" through zero "0", where said "1" key produces a said question mark "?", where said "2" key produces a said comma ",", where said "3" key produces a said exclamation mark "!", where said "4" key produces a said open quote """, where said "5" key produces a said apostrophe "'", where said "6" key produces a said closed quote """, where said "7" key produces a said open parenthesis "(", where said "8" key produces a said semi-colon ";", where said "9" key produces a said closed parenthesis ")"; where said "0" key produces a said colon ":", and after the actuation of said numbered punctuation key, said keyboard returns to said previous alphabetic mode; and g) actuation of said right pound "#" key simultaneously with or followed by the actuation of said middle zero "0" key while in the alphabetic mode, returns said keyboard to the numeric mode.

13. An apparatus for use as a computer terminal using the nine key alphanumeric binary keyboard combined with a three key binary control keyboard as claimed in claim 1.

* * * * *